(12) United States Patent
Kubo (10) Patent No.: US 7,538,805 B2
(45) Date of Patent: May 26, 2009

(54) APPARATUS FOR COMPENSATING FOR SHADING ON A PICTURE PICKED UP BY A SOLID-STATE IMAGE SENSOR OVER A BROAD DYNAMIC RANGE

(75) Inventor: Naoki Kubo, Asaka (JP)

(73) Assignee: Fujifilm Corporation, Tokyo (JP)

( * ) Notice: Subject to any disclaimer, the term of this patent is extended or adjusted under 35 U.S.C. 154(b) by 1008 days.

(21) Appl. No.: 10/623,651

(22) Filed: Jul. 22, 2003

(65) Prior Publication Data

US 2004/0125226 A1 Jul. 1, 2004

(30) Foreign Application Priority Data

Aug. 6, 2002 (JP) .............................. 2002-228562

(51) Int. Cl.
H04N 9/64 (2006.01)
H04N 5/335 (2006.01)
H04N 5/225 (2006.01)
(52) U.S. Cl. .................... 348/251; 348/315; 348/340
(58) Field of Classification Search ................ 348/251, 348/275, 340, 315, 615; 382/274
See application file for complete search history.

(56) References Cited

U.S. PATENT DOCUMENTS

| | | | | |
|---|---|---|---|---|
| 4,558,365 A | * | 12/1985 | Ochi | ........................... 348/275 |
| 6,674,470 B1 | * | 1/2004 | Tanaka et al. | ............... 348/302 |
| 6,750,437 B2 | * | 6/2004 | Yamashita et al. | .......... 348/294 |
| 6,819,360 B1 | * | 11/2004 | Ide et al. | ..................... 348/340 |
| 6,831,692 B1 | * | 12/2004 | Oda | .......................... 348/241 |
| 6,937,777 B2 | * | 8/2005 | Shirakawa | ............. 348/E5.044 |
| 7,190,403 B2 | * | 3/2007 | Yamashita et al. | .......... 257/291 |

FOREIGN PATENT DOCUMENTS

| | | |
|---|---|---|
| JP | 5-207376 A | 8/1993 |
| JP | 9-205589 A | 8/1997 |

* cited by examiner

Primary Examiner—Nhan T Tran
(74) Attorney, Agent, or Firm—Birch, Stewart, Kolasch & Birch, LLP (57) ABSTRACT

A solid-state image pickup apparatus includes photo-sensors arranged in the directions of row and column and each corresponding to a particular pixel included in an imaging frame. Each photo-sensor is made up of a higher- and a lower-sensitivity photosensitive cell for photoelectrically transducing incident light to electric signal charges. A corrector executes shading correction on an image signal derived from the higher-sensitivity photosensitive cell in accordance with the shading characteristic of the higher sensitivity photosensitive cell, and on an image signal derived from the lower-sensitivity photosensitive cell in accordance with the shading characteristic of the lower-sensitivity photosensitive cell.

10 Claims, 8 Drawing Sheets

APPARATUS FOR COMPENSATING FOR SHADING ON A PICTURE PICKED UP BY A SOLID-STATE IMAGE SENSOR OVER A BROAD DYNAMIC RANGE

BACKGROUND OF THE INVENTION

1. Field of the Invention

The present invention relates to a shading corrector apparatus compensating for shading on image signals produced from a solid-state image sensor having an array of photosensors, each of which has a set of photosensitive cells different in sensitivity from each other.

2. Description of the Background Art

As known in the art, a solid-state image sensor of the type is available which has its dynamic range narrower with respect to intensity of light incident thereto. The dynamic range has its upper limit defined by the output level of the individual photosensitive cell saturating when input light intensity exceeds a preselected value, and has its lower limit restricted by the S/N (Signal-to-Noise) ratio of a signal derived from incident light increasing above a preselected value. It follows that if the sensitivity of the photosensitive cell is increased to broaden the dynamic range, then saturation is likely to occur so as to prevent an adequate amount of light from being attained. To broaden the dynamic range also, if the sensitivity of the photosensitive cell is lowered, then the noise level remains constant without regard to sensitivity so that the lower limit of the dynamic range has to rise accordingly to a decrease in S/N ratio. In any case, therefore, the dynamic range becomes narrowed.

In light of the above, Japanese patent laid-open publication No. 207376/1993 discloses a solid-state image pickup apparatus having photodiodes, each of which is divided into a plurality of regions, or photosensitive cells. In this image pickup apparatus, a switching device is assigned to each of the photodiodes to switch a photosensitive area generating a signal charge which is to be stored in the capacitive element of a unit pixel, thereby establishing the switchable sensitivity of the photosensitive array. In this configuration, even where the capacitance of the capacitor, which is decisive over the sensitivity, is reduced in order to increase the sensitivity, the reduced photosensitive area can lower the sensitivity for picking up a relatively lighter subject, thereby obviating the saturation within a controllable range of integration period of time. For picking up a relatively darker subject, the photosensitive area can be increased to increase the sensitivity, thereby accomplishing the operation within a shorter integration period of time. Consequently, the image pickup apparatus taught by the above document successfully broadens the dynamic range.

Japanese patent laid-open publication No. 205589/1997 teaches a solid-state image pickup apparatus in which each of the photo-sensors is segmented into a plurality of photosensitive regions, or photosensitive cells, different in sensitivity from each other. Signal charges read out from the photosensitive regions of nearby photo-sensors having the same sensitivity are mixed by a vertical transfer register and then transferred in the vertical direction of the photosensitive array. At the same time, signal charges read out from the photosensitive regions different in sensitivity are transferred by a plurality of horizontal transfer registers independently of each other. Further, from the photosensitive region or regions at least except those with the lowest sensitivity, the signal charges, or signals based thereon, are derived to be clipped and mixed with or added to the signal charges, or signals based thereon, outputted from the remaining photosensitive region or regions including those with the lowest sensitivity. Consequently, signal charges, or signals based thereon, at the higher sensitivity side are clamped at the same clamp level, so that the dynamic range is broadened without generating fixed-pattern noise ascribable to irregularity in saturation level of the pixels.

Generally, in a solid-state image pickup apparatus, image signals outputted from a solid-state image sensor may involve shading due to, e.g. irregularity in quantity of light incident to the respective photosensitive cells. In the case of a digital camera of the type including microlenses formed on the photosensitive array of its image sensor, the quantity of light incident to the respective photosensitive cells noticeably varies in dependence upon the direction of the incidence particular to the microlenses. More specifically, to a photosensitive cell located in the vicinity of the edge of the imaging frame of the image sensor, light is incident often inclined, so that the incident light is poorer in quantity than one incident to a photosensitive cell located near the center of the frame. Consequently, luminance of the signals produced in the vicinity of the edge of the frame is poorer, thus resulting in shading.

It is a common practice with a digital camera of the type described above to use, e.g. digital processing and a memory to correct image signals involving shading, thereby simplifying a shading correcting circuit. Shading is generally classified into black shading ascribable to an image pickup tube or CCDs (Charge-Coupled Devices) and white shading ascribable to a prism or a lens included in optics. To correct, e.g. black shading, it has been customary to store in a buffer memory black shading data generated with no incident light received and then subtract, during usual imaging operation, the output of the buffer memory from the image signals produced the imaging operation.

The conventional solid-state image pickup apparatus described above mixes signal charges outputted from a set of photosensitive cells, different in sensitivity from each other, of each pixel, thereby producing pixel-by-pixel image signals over a broad dynamic range. However, the shading of the image signals cannot adequately be compensated for because the photoelectric transduction characteristic and the incidence angle of light, for example, differ from one to another photosensitive cell.

SUMMARY OF THE INVENTION

It is an object of the present invention to provide an apparatus adequately compensating for shading on a picture picked up by a solid-state image sensor over a broad dynamic range.

A solid-state image pickup apparatus of the present invention includes photo-sensors arranged in the directions of row and column and each corresponding to a particular pixel included in an imaging frame. Each photo-sensor is made up of a first and a second photosensitive cell respectively having first and second sensitivity for photoelectrically transducing incident light to electric signal charges. The second sensitivity is lower than the first sensitivity. A corrector executes shading correction on a first image signal derived from the first photosensitive cell in accordance with the shading characteristic of the first photosensitive cell, and on a second image signal derived from the second photosensitive cell in accordance with the shading characteristic of the second photosensitive cell.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Preferred embodiments of the solid-state image pickup apparatus in accordance with the present invention will be described hereinafter. Briefly, in the illustrative embodiments to be described, each of the photo-sensors forming a photosensitive array or imaging frame includes a set of, e.g. a pair of, photosensitive regions, or photosensitive cells. The sensitivity or photoelectric transduction efficiency of the photosensitive regions, or photosensitive cells, of each of the photosensitive cells differs from each other in terms of the size of the regions. This successfully broadens the dynamic range and executes shading correction on image signals to thereby prevent image quality from falling.

The shading correction of the embodiments is accomplished with particular shading correction data assigned to each photosensitive cell in consideration of the influence of the arrangement of photosensitive cells or pixels and the quantity or the angle of incidence of light from a desired scene. This enables image signals derived from the photosensitive cells, differing in sensitivity from each other, of each of the photo-sensors to be subject to particular, adequate shading correction.

Further, the one photosensitive cell with the lower sensitivity of each of the photo-sensors, or pixel positions, is positioned at a side farther from the center of the imaging frame, e.g. at the top right, the top left, the bottom right or the bottom left of the frame with respect to the other photosensitive cell with the higher sensitivity of that photo-sensor. The lower-sensitivity photosensitive cells are arranged generally symmetrically with respect to the center of the frame with the higher-sensitivity photosensitive cells intervening toward the center. With this configuration, it is possible to obviate the polarization of shading in the frame and execute the same shading correction on both of the higher- and lower-sensitivity photosensitive cells.

With the specific illustrative embodiments, the sensitivity differs between the pair of photosensitive cells of a photo-sensor in terms of the size or area thereof. The difference in sensitivity may also be achieved by a color filter, a microlens or the amount of impurity doped in the photosensitive region.

Figure 6:
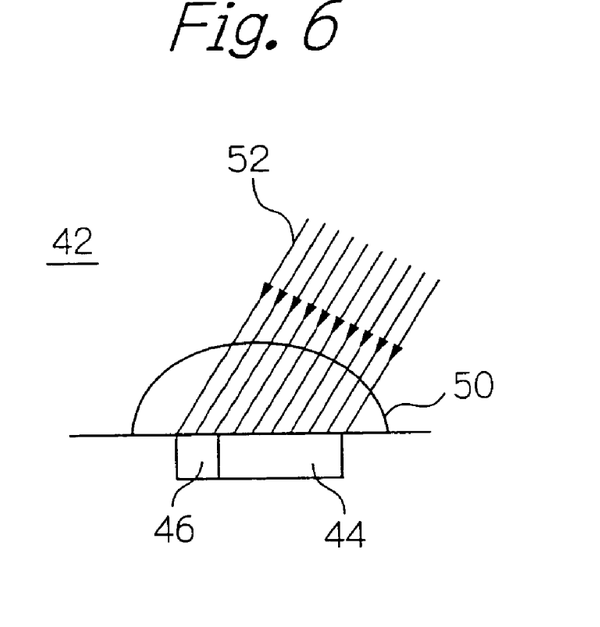
FIG. 6 schematically shows a section of a single photo-sensor located near the center of the imaging frame of the embodiment shown in FIG. 1.
Figure 7:
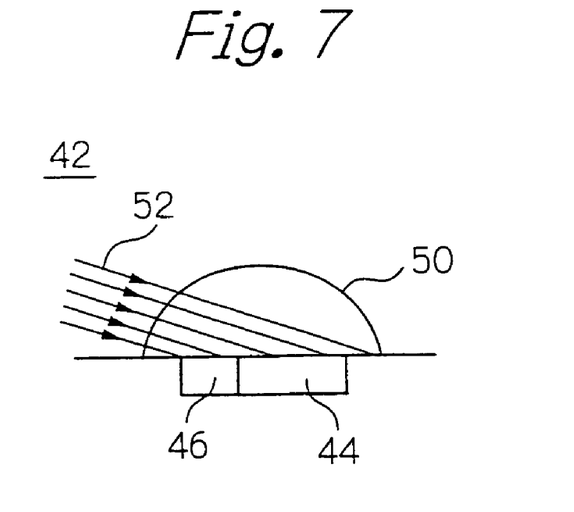
FIG. 7 shows, similarly to FIG. 6, a section of a single photo-sensor located in the vicinity of the edge of the imaging frame.

FIGS. 6 and 7 show a specific photo-sensor 42 where a microlens 50 is formed and constitutes a single pixel. The quantity of light incident to each of the photosensitive cells 44 and 46 forming the photo-sensor 42 is noticeably in dependence upon the incidence angle of the light 52 due to the influence of the microlens 50. Generally, as shown in FIG. 6, a sufficient quantity of light 52 is incident to a photo-sensor 42 located near the center of the imaging frame. However, as shown in FIG. 7, light 52 incident to a photo-sensor 42 located near the edge or peripheral of the frame is so inclined that the resulting image signal is lower in level than the image signal outputted from the photo-sensor 42 of FIG. 6. Moreover, in the case of FIG. 7, the effective photosensitive area available with a lower-sensitivity photosensitive cell 46 is smaller and allows, depending on the incidence angle, hardly any part of the light 52 to be incident thereto.

Figure 3:
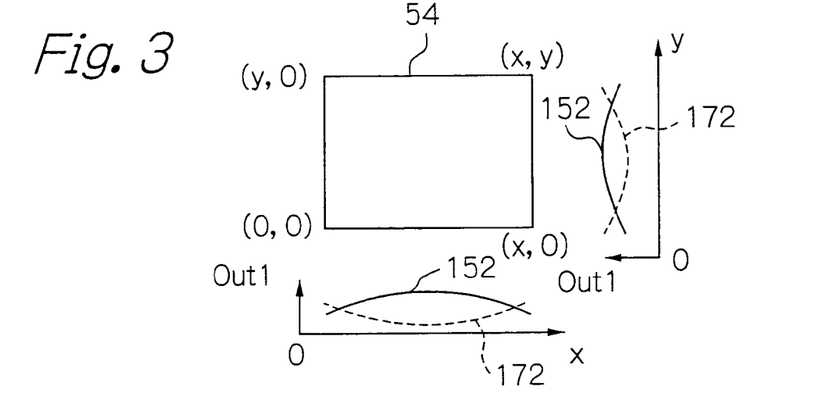
FIG. 3 is a graph plotting the outputs of higher-sensitivity photosensitive cells positioned at all pixels in the imaging frame of the embodiment shown in FIG. 1.
Figure 4:
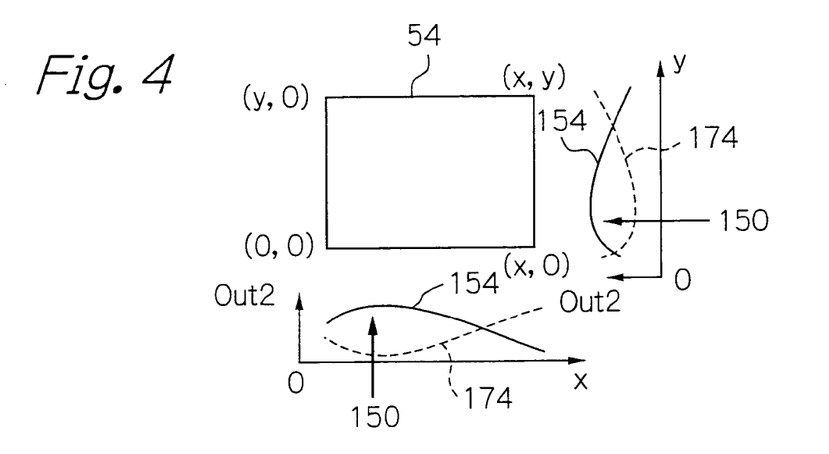
FIG. 4 plots, similarly to FIG. 3, the outputs of lower-sensitivity photosensitive cells with the polarization of shading positioned at all pixels.
Figure 5:
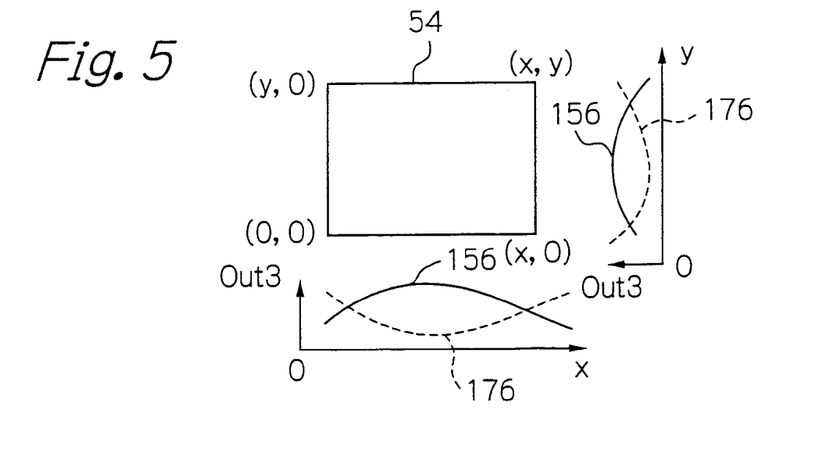
FIG. 5 plots, similarly to FIG. 4, the outputs of lower-sensitivity photosensitive cells particular to an alternative embodiment shown in FIG. 8.

FIGS. 3, 4 and 5 each show the outputs of photo-sensors 42 located in particular pixel positions of a single imaging frame 54. In the frames 54 shown in FIGS. 3, 4 and 5, a higher- and a lower-sensitivity photosensitive cell 44 and 46 are provided in a pair at each single pixel position or photo-sensor, so that a pixel signal is represented by the mixture between the pair of photosensitive cells. FIG. 3 plots the outputs out1 of the higher-sensitivity photosensitive cells 44 in response to the incident light 52. As shown, the outputs out1 are lower in level near the edge of the frame than at the center, as represented by curves 152, each of which is symmetrical in the right-and-left and the up-and-down directions with respect to the center of the frame. FIG. 4 plots the outputs out2 of the lower-sensitivity photosensitive cells 46 obtainable for the same quantity of incident light 52 as in FIG. 3. As shown, while the outputs out2 are lower in level toward the edge of the frame like the outputs out1, the outputs out2 are represented by curves 154 each including the polarization of shading 150. The present invention adequately compensates for the polarization of shading 150, or produces image signals with a device structure free from the polarization of shading, as shown in FIG. 5.

Figure 1:
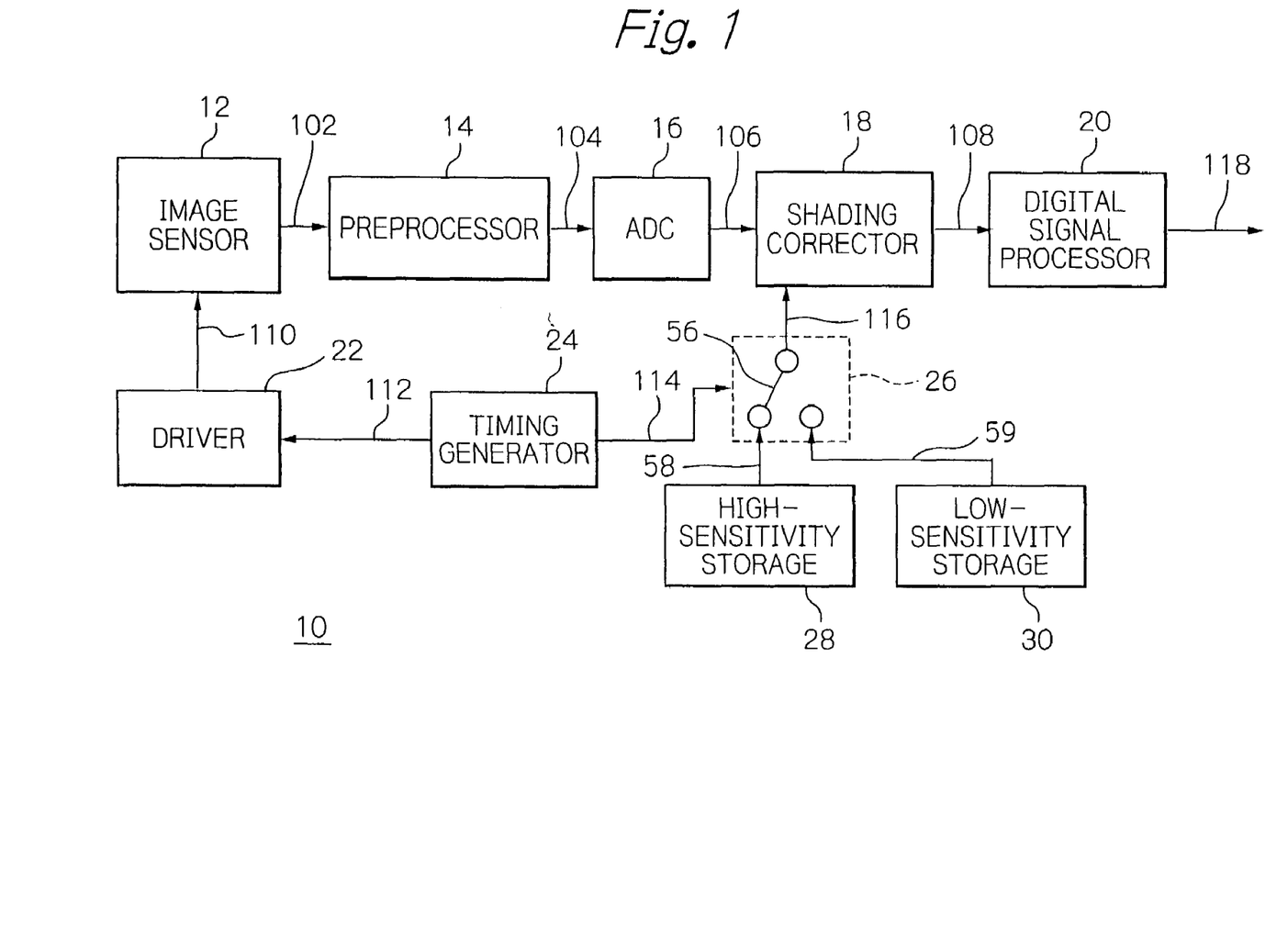
FIG. 1 is a schematic block diagram showing a solid-state image pickup apparatus embodying the present invention.

Referring now to FIG. 1, a solid-state image pickup apparatus embodying the present invention is implemented as a digital camera by way of example. As shown, the digital camera, generally 10, includes a solid-state image sensor 12, a preprocessor 14, an ADC (Analog-to-Digital Converter) 16, a shading corrector 18, a digital signal processor 20, a driver 22, a timing signal generator 24, a switch or selector 26, and a high-sensitivity storage 28 and a low-sensitivity storage 30 interconnected as depicted. The digital camera 10 is generally constructed to focus an optical image representative of a desired scene on the imaging frame, or an array of photo-sensors, of the image sensor 12, which in turn generates image signals corresponding to the optical image. It is to be noted that part of the digital camera 10 not directly relevant to the understanding of the present invention are neither shown nor will be described. Also, signals are designated by reference numerals attached to connect lines on which they appear.

Figure 2:
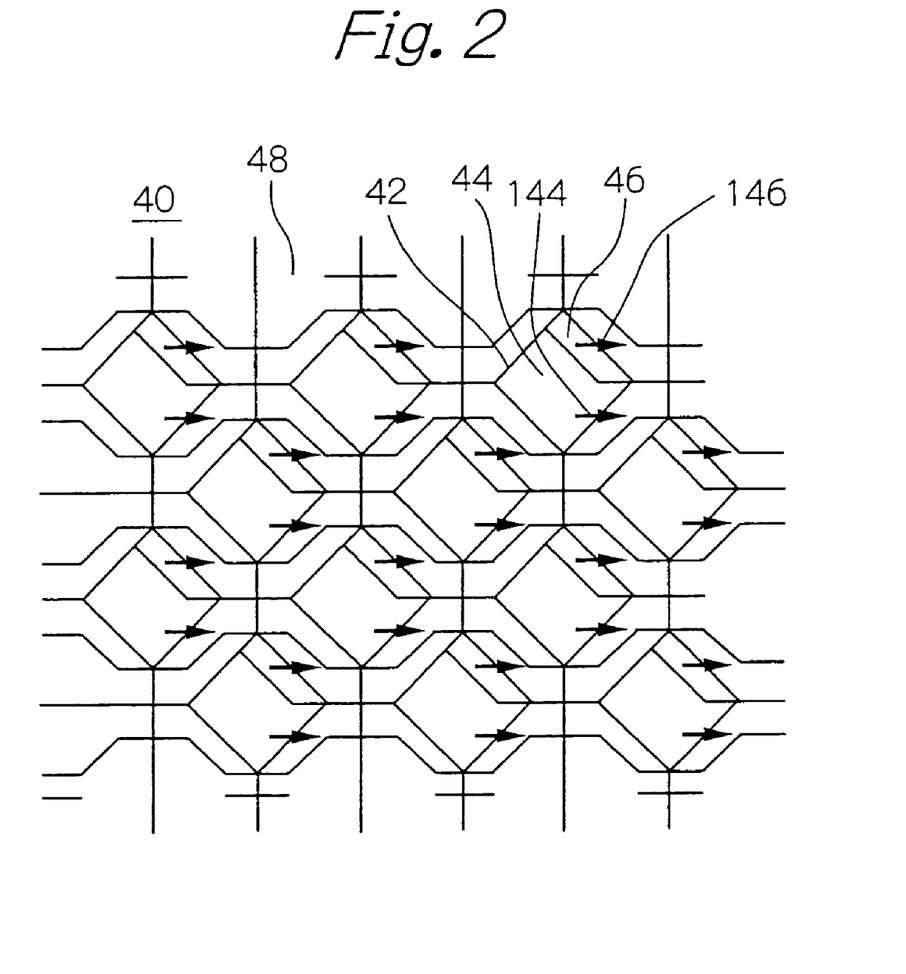
FIG. 2 is a fragmentary plan view schematically showing part of the imaging frame of the illustrative embodiment, as seen from the light incidence side.

The image sensor 12 has a photoelectric transducing and a scanning function, and is, in the illustrative embodiment, implemented as a CCD image sensor although it may be implemented as, e.g. a CMOS (Complementary Metal Oxide Semiconductor) image sensor. As shown in FIG. 2, the image sensor 12 has an imaging frame 40 in which a plurality of photo-sensors 42, each forming to a particular pixel, are arranged in rows and columns. While each photo-sensor 42 is shown as being substantially square, it may be differently polygonal or circular, if desired. FIG. 2 shows only part of a number of photo-sensors arranged in the photosensitive area 40 for the sake of simplicity of illustration.

More specifically, with reference to FIG. 2, the photo-sensors 42 are arranged in a so-called honeycomb pattern, i.e. each photo-sensor 42 is shifted from nearby photo-sensors 42 by a single row and a single column. In other words, each photo-sensor 42 is shifted from nearby photo-sensors 42 by a distance substantially corresponding to a single photo-sensor. Alternatively, the image sensor 12 may be adapted such that the photo-sensors 42 are arranged in a substantially square matrix at a fixed pitch in the directions of row and column, if desired. Each photo-sensor 42 is made up of a higher-sensitivity photosensitive cell 44 and a lower-sensitivity photosensitive cell 46 having a larger and a smaller sensitive area, respectively. The lower-sensitivity photosensitive cell 46 is positioned at one side, e.g. the upper right side, in the figure, of the higher-sensitivity photosensitive cell 44, as illustrated. The photosensitive cells 44 and 46 photoelectrically transduce the quantity of light 52 incident thereto to a corresponding electric signal and may be implemented by, e.g. a photodiode. If desired, a single photodiode may be segmented into the two photosensitive cells 44 and 46.

Referring again to FIG. 1, the driver 22 feeds drive signals 110 to the image sensor 12 for driving it. In response to the drive signals, the image sensor 12 feeds pixel-by-pixel signal charges corresponding to the quantities of incident light 52 to the preprocessor 14 in the form of image signals 102. The drive signals 110 include a plurality of timing signals and, e.g. electronic shutter pulses, vertical drive pulses, and horizontal drive pulses. More specifically, in response to the drive signals 110, the image sensor 12 sequentially delivers signal charges, or optical charges, from all of the pixels constituting the imaging frame 40 to the preprocessor 14 in accordance with the scanning system used.

The driver 22 generates the drive signals mentioned above in response to a control signal 112 outputted from the timing generator 24. More specifically, the driver 22 uses a vertical timing signal and transfer gate pulses to generate, e.g. tri-level vertical drive pulses. The timing generator 24 generates various timing signals including the vertical drive timing signal and transfer gate pulses mentioned above as well as a horizontal drive timing signal. For example, the timing generator 24 feeds control signals 112 and 114 to the driver 22 and the switch 26, respectively, so as to drive the image sensor 12 and to select shading correction data 58 or 59.

The preprocessor 14, which executes analog signal processing on the image signals 102 outputted from the image sensor 12, includes, e.g. a CDS (Correlated Double Sampling) circuit and a GCA (Gain-Controlled Amplifier) although not shown specifically. The preprocessor 14 has its output 104 input to the ADC 16 converting the output 104 to a digital image signal 106 thereby. The digital image signal 106 is input to the shading corrector 18.

The shading corrector 18 uses, e.g. shading correction data to compensate for shading particular to the digital image signal 106, i.e. correcting unevenness in quantity of light 52 incident to the photosensitive cells 44 and 46. More specifically, by using shading correction data, the shading corrector 18 compensates for black and white shading incurred in the image signal 106. The shading corrector 18 outputs corrected image signal 108 to the digital signal processor 20.

In the illustrative embodiment, the shading correction data are made up of correction data for correcting image signals 144 outputted from the higher-sensitivity photosensitive cells 44 (hereinafter referred to as high-sensitivity correction data) and correction data for correcting image signals 146 outputted from the lower-sensitivity photosensitive cells 46 (also hereinafter referred to as low-sensitivity correction data). For example, the high-sensitivity correction data are defined by a set of curves 172 (see FIG. 3) so that the curves 152, FIG. 3, are corrected to straight lines each corresponding to the maximum value around the center of the curve 152. On the other hand, the low-sensitivity correction data are defined by another set of curves 174 (see FIG. 4) so that the curves 154 involving the polarization 150 are corrected to straight lines each corresponding to the maximum value around the center of the polarization 150.

The high- and low-sensitivity correction data stated above are stored in the high- and low-sensitivity storages 28 and 30, respectively. The storages 28 and 30, implemented by a RAM (Random-Access Memory) or a ROM (Read-Only Memory), are connected to the shading corrector 18 via the selector switch 26. Therefore, the high- or the low-sensitivity correction data 58 or 59 are delivered selectively from the storage 28 or 30, respectively, to the shading corrector 18 via the switch 26. The switch 26 selects either one of the high- and low-sensitivity correction data 58 and 59 in response to the control signal 114 outputted from the timing generator 24.

The digital signal processor 20 executes various operations on the input image signal 108 and develops the resulting image signal 118 from its output 118. In the illustrative embodiment, the digital signal processor 20 is adapted to mix, pixel by pixel, the image signals outputted from the higher- and lower-sensitivity photosensitive cells and included in the image signal 108 by using, e.g. an adder. Further, the digital signal processor 20 executes gamma correction for correcting the tonality of the R (red), G (green) and B (blue) image signals 108 and then converts the corrected image signal 108 to a Y/C image signal, which consists of a luminance (Y) signal and a color difference (C) signal.

The digital signal processor 20 have its output 118 connected to utility circuitry such as a monitor for displaying the processed image, a communication device for sending out the image signal to another apparatus, a recorder for storing the image signal in a data storage medium or a printer for printing the image although not shown specifically. The digital signal processor 20 is therefore configured to convert the image signal to a data format particular to the apparatus connected to the output 118.

In operation, the image sensor 12 picks up a desired scene carried by light 52 incident to the frame 40 in response to the drive signals 110. The resulting signal charges generated by the photosensitive cells, which are arranged in the frame 40, are read out to vertical transfer paths (V (Vertical) CCDs) 48, FIG. 2, in response to the vertical drive pulses and then sequentially transferred to a horizontal transfer path (H (Horizontal) CCDs), not shown. Subsequently, the signal charges are sequentially transferred along the horizontal transfer path toward the output side in response to the horizontal drive pulses. At the output side, the signal charges are sequentially converted to corresponding electric signals, which are in turn outputted to the preprocessor 14 in the form of image signals 102 on a photosensitive-cell basis. It should be noted that in the illustrative embodiment the higher- and lower-sensitivity photosensitive cells 44 and 46 positioned at each pixel output the signal charges independently of each other.

The signal charges are read out from the frame 40 in a manner such as a color-multiplexing system storing a field with two rows mixed or an entire-pixel read-out system.

In the preprocessor 14, the CDS circuit mentioned earlier removes noise components from the input image signals 102 by the correlated double sampling, and then the gain-controlled amplifier amplifies the resulting noise-free image signals 102 with its preselected gain. The image signals 104 thus subjected to analog processing are converted to digital image signals 106 by the ADC 16 and then input to the shading corrector 18.

The shading corrector 18 multiplies the image signals by correction data 116 to correct the input image signals 106. In the illustrative embodiment, when the image signal 106 inputted to the shading corrector 18 is a high-sensitivity image signal, the switch or selector 26 transfers the high-sensitivity correction data 58 from the high-sensitivity storage 28 to the shading corrector 18 as shading correction data 116 in response to the control signal 114, as depicted with a solid line 56. Similarly, in response to the control signal 114, when the image signal 106 is a low-sensitivity image signal, the switch 26 shifts its position to that opposite to the solid line 56 to transfer the low-sensitivity correction data 59 from the low-sensitivity storage 30 to the shading corrector 18 as shading correction data 116.

In the illustrative embodiment, the shading corrector 18 multiplies the high-sensitivity image signal by the high-sensitivity correction data 58 represented by the curves 172, FIG. 3, to correct the signal 106. Also, the shading corrector 18 multiplies the low-sensitivity image signal by the low-sensitivity correction data 59 represented by the curves 174, FIG. 4, to correct the signal 106. The shading corrector 18 develops on its output the image signals 108 in which the polarization of the shading described above has thus been compensated for.

The image signals 108 thus corrected by the shading corrector 18 are input to the digital signal processor 20. The digital signal processor 20 mixes, e.g. by addition, the outputs of the higher- and lower-sensitivity photosensitive cells 44 and 46 of each pixel with each other to constitute a pixel signal.

As stated above, the illustrative embodiment assigns particular, adequate shading correction data to each of the higher- and lower-sensitivity photosensitive cells constituting a single pixel. This adequately compensates for the shading, even polarized, of an image. Further, by mixing the outputs of the higher- and lower-sensitivity photosensitive cells with each other, the camera 10 achieves a broad dynamic range.

Figure 8:
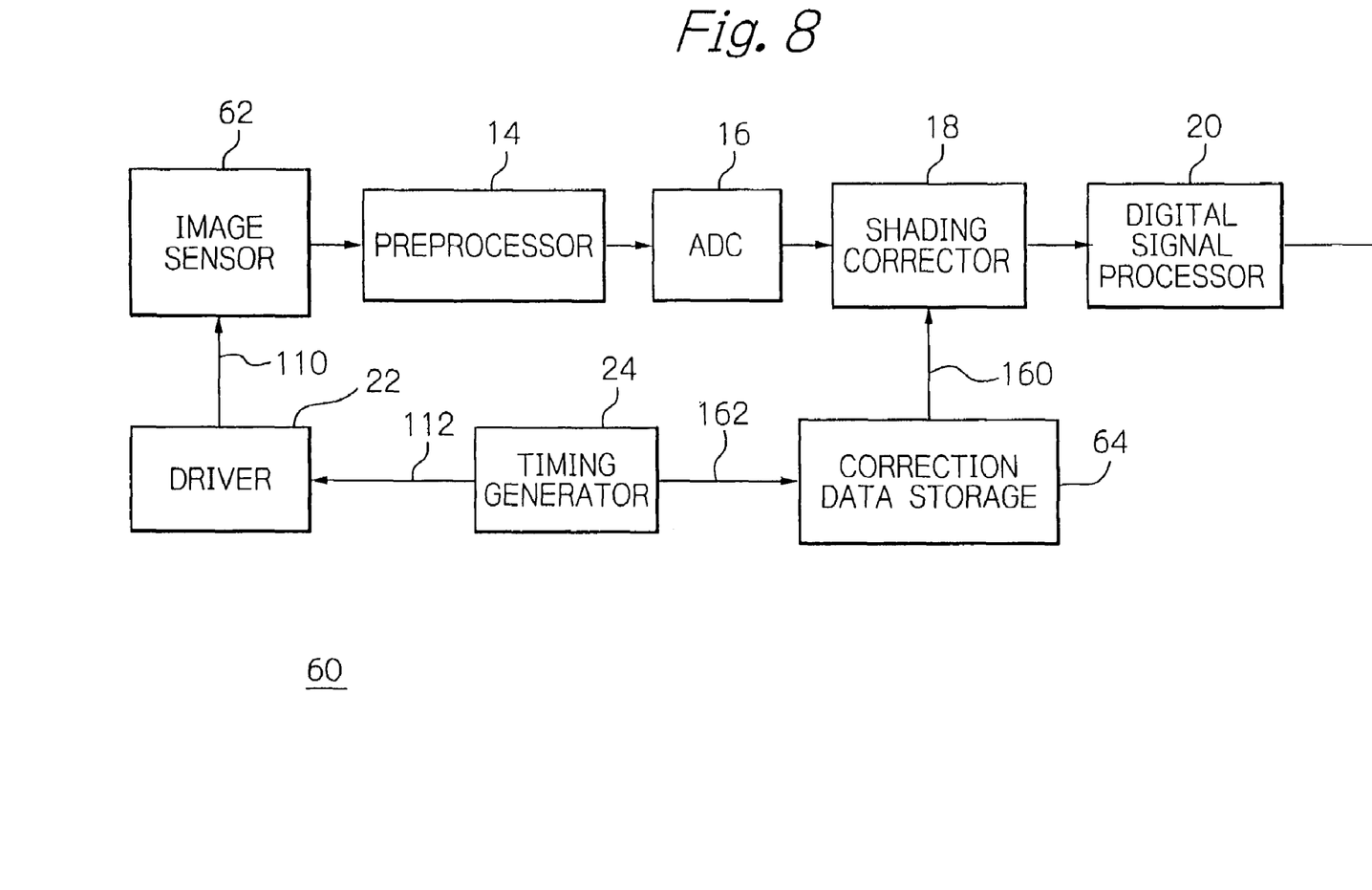
FIG. 8 is a schematic block diagram, similar to FIG. 1, showing an alternative embodiment of the present invention.

An alternative embodiment of the present invention will be described hereinafter with reference to FIGS. 8 and 9. Briefly, in the instant embodiment, the lower-sensitivity photosensitive cell 98 at each pixel is positioned at a side farther from the center 90 of the imaging frame 80, e.g. at the top right, the top left, the bottom right or the bottom left of the associated higher-sensitivity photosensitive cell 96, and generally symmetrically with respect to the center 90 of the frame 80. With this arrangement, it is possible to apply the same shading correction to both of the higher- and lower-sensitivity photosensitive cells. In FIG. 8, structural elements like those shown in FIG. 1 are designated by identical reference numerals and will not be described specifically in order to avoid redundancy.

As shown in FIG. 8, a digital camera, generally 60, is the same as the embodiment shown in FIG. 1 except that the digital camera 60 includes a solid-state image sensor 62 and a correction data storage 64 rather than the image sensor 12, switch 26 and storages 28 and 30 of the digital camera 10 shown in FIG. 1. As shown in FIG. 9, the image sensor 62 has an imaging frame 80 in which photo-sensors 82, 84, 86 and 88 forming pixels are arranged in a honeycomb pattern. In the illustrative embodiment, where photo-sensors 82, 84, 86 and 88 are arranged around the center 90 of the frame 80, the lower-sensitivity photosensitive cells 98 are respectively located at the top right, bottom right, bottom left and top left positions, as viewed in FIG. 9. This is also true with the remaining photo-sensors, so that the lower-sensitivity photosensitive cells 98 all are arranged concentrically around the center 90 of the frame 80. While this arrangement is only illustrative, the lower-sensitivity photosensitive cell 98 at each pixel position should preferably be positioned at a side farther from the center 90 of the frame 80.

More specifically, lower-sensitivity photosensitive cells 98 lying in the frame 80 are arranged concentrically around the center 90 of the area 80, so that their outputs are free from the shading polarization 150, FIG. 4. For example, as shown in FIG. 5, the outputs out3 of the lower-sensitivity photosensitive cells 98 are lower in level near the edge of the frame 90 than near the center, as represented by curves 156 each being substantially symmetrical in the right-and-left or the top-bottom direction with respect to the center 90 of the frame 80. With this instance, higher-sensitivity photosensitive cells 96 can receive light with a minimum of influence of the above-stated arrangement of the low-sensitivity cells 98 because each of the cells 96 has its comparatively larger photosensitive area.

In the illustrative embodiment, the outputs of the higher-sensitivity photosensitive cells 96 are represented by the curves 152, FIG. 3, while the outputs of the lower-sensitivity photosensitive cells 98 are represented by curves 156, FIG. 5. The photosensitive cells 96 and 98 produce respective outputs that have an identical maximum value or saturation value. This, coupled with the fact that a decrease in level near the edge of the frame 80 is ascribable to shading, allows the curves 152 and 156 to be shared, i.e. allows the same correction data to be used for shading correction. This is why the digital camera 60 includes only a single correction data storage 64.

As shown in FIG. 8, the sole correction data storage 64, also implemented by a RAM or a ROM, stores common shading correction data 160 applicable to the outputs of both of the higher- and lower-sensitivity photosensitive cells 96 and 98. The common shading correction data, labeled 160, is fed to the shading corrector 18 in response to a control signal 162 outputted from the timing generator 24.

Figure 9:
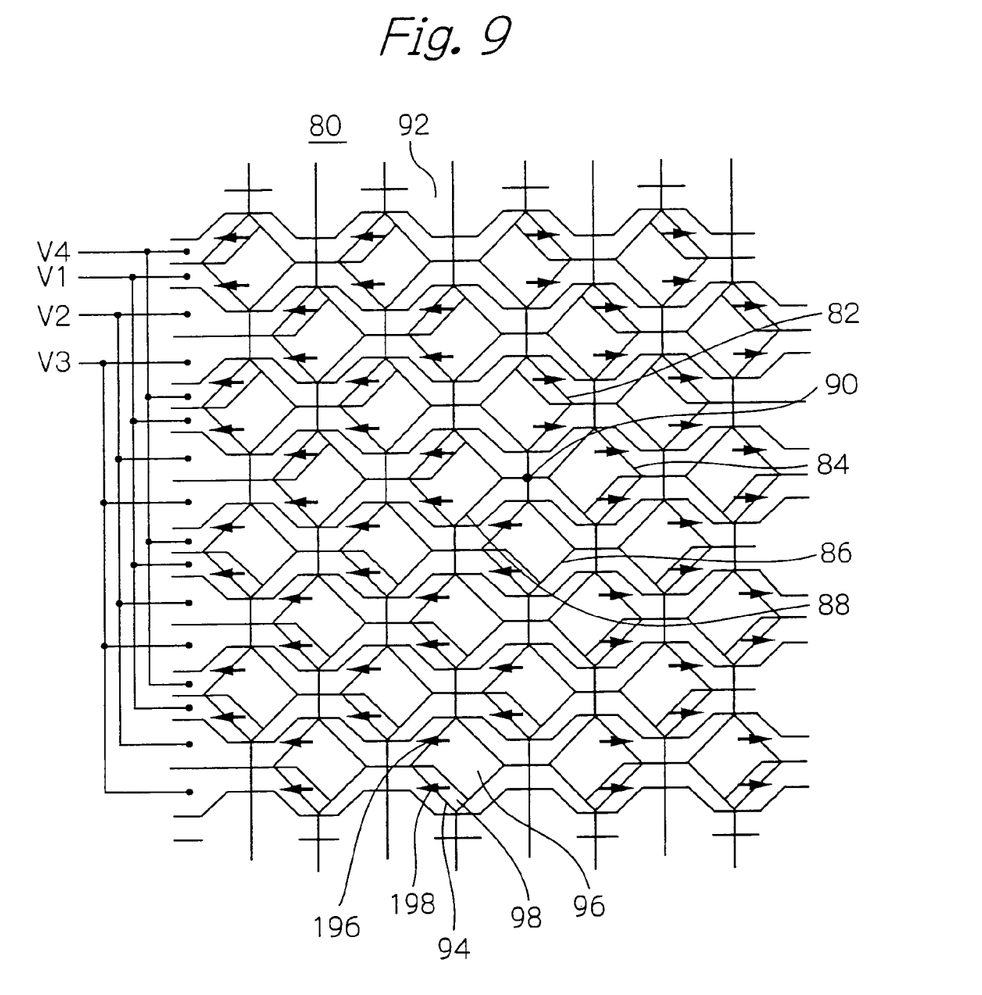
FIG. 9 is a fragmentary plan view, similar to FIG. 2, showing part of the frame of the alternative embodiment, as seen from the light incidence side.

As shown in FIG. 9, a plurality of vertical transfer paths 92 extend in the frame 80 zigzag in such a manner as to skirt round the photo-sensors 82 through 88. Each vertical transfer path 92 is formed with vertical transfer electrodes for transferring signal charges outputted from the associated photo-sensors in the direction of column.

More specifically, in the illustrative embodiment, four vertical transfer electrodes V1 through V4 are connected to each vertical transfer path, forming four different regions. This provides each photo-sensor with a four-electrode structure. When vertical drive pulses are applied to the vertical transfer electrodes V1 through V4, signal charges are read out to the vertical transfer paths 92 and then sequentially transferred toward the horizontal transfer path along the vertical transfer paths 92. The horizontal transfer path functions in the same manner as in the previous embodiment. Again, to read out the signal charges, use may be made of a color-multiplexing system storing a field with two rows mixed or an entire-pixel read-out system.

In the illustrative embodiment, where lower-sensitivity photosensitive cells 98 are located at the top right or the top left position, as shown in FIG. 9, the higher-sensitivity photosensitive cells 96 associated with the cells 98 are connected to the vertical transfer electrodes V1 and V3, while the lower-sensitivity photosensitive cells 98 are connected to the vertical transfer paths V2 and V4. In addition, the lower-sensitivity cells 98 are also located at the bottom right or the bottom left position, so that the low- and high-sensitivity cells 98 and 96 will be connected to the electrodes V1 and V3 and to the electrodes V2 and V4, respectively.

The photosensitive cells are formed with transfer gates, not shown, that allow signal charges to be read out without leaking. To the transfer gates, transfer gate pulses or field shift pulses are fed via the associated electrodes, and then cause signal charges to be transferred from the photosensitive cells to the vertical transfer paths 92.

Figure 10:
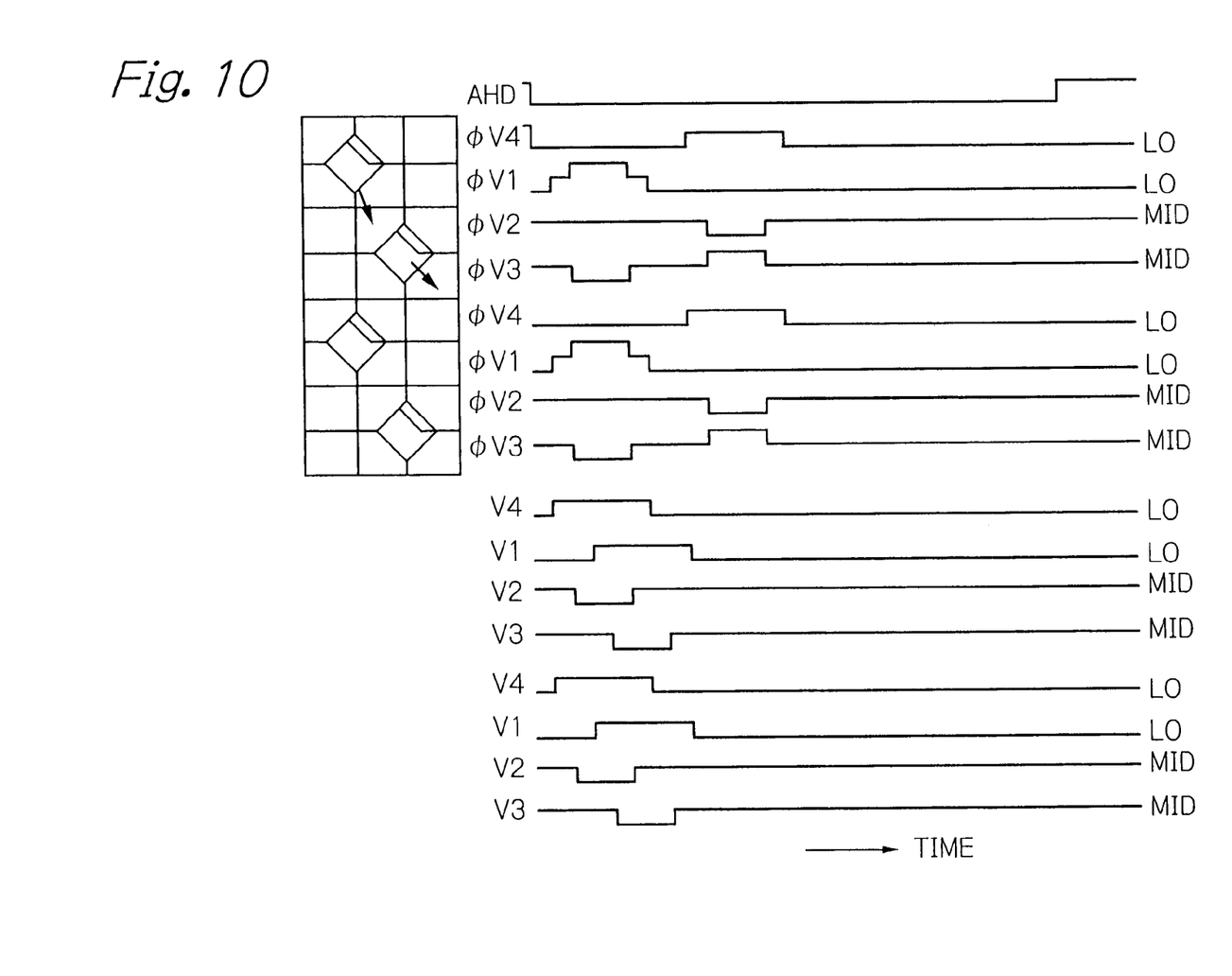
FIG. 10 is a timing chart showing vertical drive timing signals and vertical drive pulses respectively outputted from the timing generator and the driver in the first field in the alternative embodiment, in connection with part of the frame.
Figure 11:
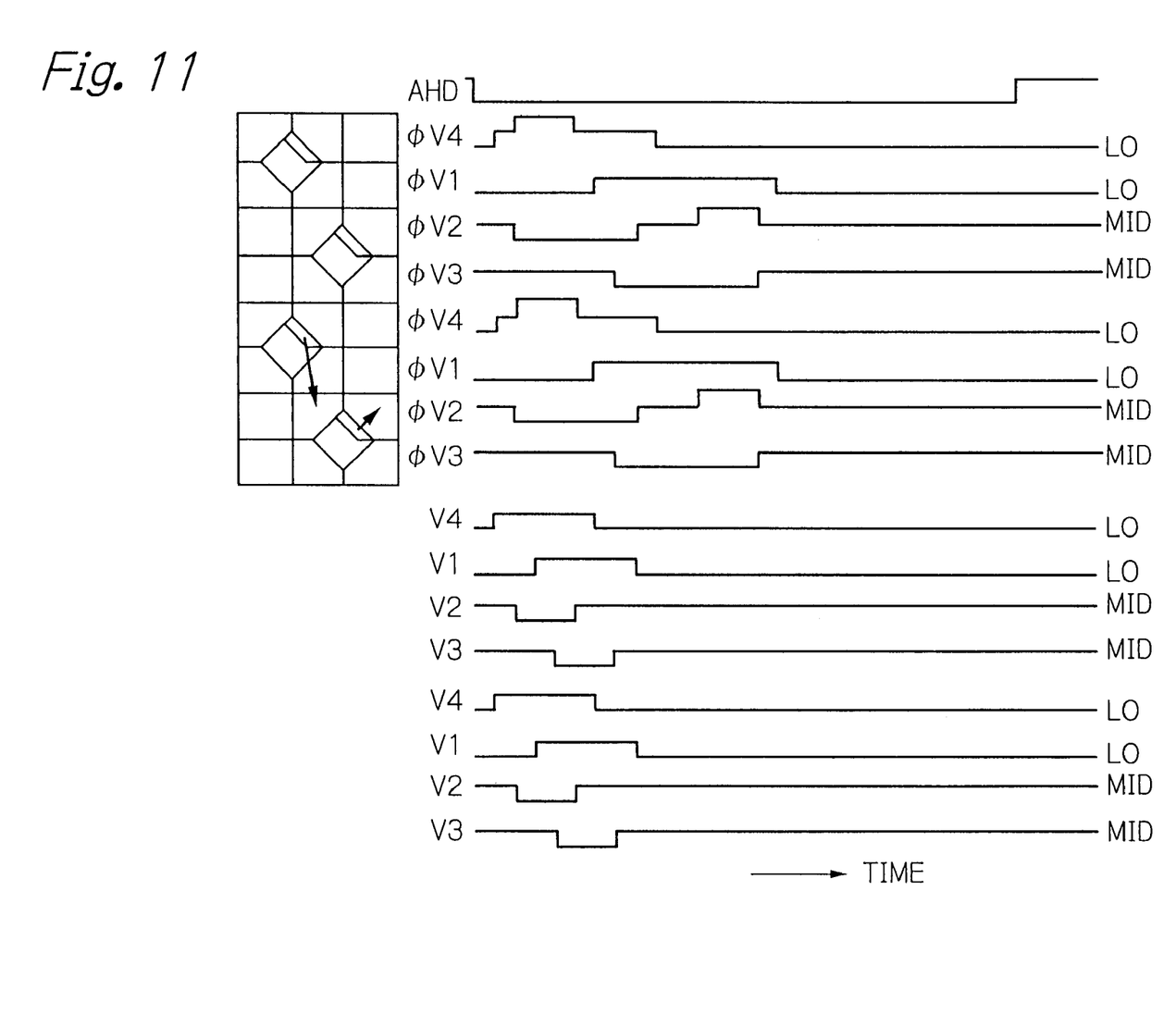
FIG. 11 is a timing chart, similar to FIG. 10, showing vertical drive timing signals and vertical drive pulses respectively outputted from the timing generator and the driver in the second field in the alternative embodiment, in connection with the part of the frame.

Reference will be made to FIGS. 10 and 11 for describing signals relating to the drive signal 110 applied to the image sensor 62 specifically. When vertical transfer is effected by n-phase drive (n being a natural number), the timing generator 24 and driver 22 output vertical drive timing signals Vn and vertical transfer pulses $\phi$Vn, respectively. FIGS. 10 and 11 show waveforms appearing in the first and second, or odd- and even-numbered, fields, respectively. As shown, the vertical drive timing signals V1 through V4 and vertical transfer pulses $\phi$v1 through $\phi$V4 appear in each of the first and second fields with the four-phase drive system. The vertical drive timing signals V1 through V4 outputted from the timing generator 24 each are a bi-level signal selectively taking its high or low level. The vertical drive pulses $\phi$V1 through $\phi$V4, each are a tri-level signal selectively taking its high, medium or low level, generated by the driver 22 on the basis of, e.g. the vertical timing signals V1 through V4 and transfer gate pulses.

The vertical drive signals $\phi$Vn thus generated are applied to the vertical transfer electrodes formed on the vertical transfer paths 92. When the drive signals $\phi$Vn are in the high level thereof, the transfer gates are turned on or conductive with the result that signal charges are transferred from the photosensitive cells to the vertical transfer paths 92. When the drive signals $\phi$Vn are in the medium level thereof, the vertical transfer paths 92 transfer the signal charges in accordance with the depth of a potential formed in each path 92. In this manner, the illustrative embodiment uses the transfer gate pulses and vertical drive timing signals Vn to transfer signal charges from the photosensitive cells to the vertical transfer paths 92, thus controlling the transfer of the signal charges along the paths 92.

In the illustrative embodiment, the shading corrector 18 uses the common shading correction data 160 to execute shading correction on the outputs of both of the higher- and lower-sensitivity photosensitive cells 96 and 98 and deliver the corrected image signal to the digital signal processor 20. The digital signal processor 20 mixes the corrected image signals derived from the outputs of the higher- and lower-sensitivity photosensitive cells with each other, thereby broadening a dynamic range.

With the embodiment described above, the shading corrector 18 can use the same correction data commonly to the outputs of both higher- and lower-sensitivity photosensitive cells 96 and 98. In such an embodiment, the shading corrector 18 may be adapted to receive image signals produced resultantly from mixing both outputs pixel by pixel and effect shading correction on the resultant image signals. In the latter modification, the higher- and lower-sensitivity outputs may be mixed by any one of the image sensor 12, preprocessor 14 and ADC 16 instead of by the digital signal processor 20.

As stated above, in the latter illustrative embodiment, the lower-sensitivity photosensitive cells 98, each forming part of a particular pixel, are arranged in the frame 80 of the image sensor 62 concentrically around the center 90 of the frame, thereby obviating the polarization of shading. Therefore, the outputs of the higher- and lower-sensitivity cells can be corrected with the same shading correction data. In addition, such shading correction reduces load on the shading corrector 18.

In summary, it will be seen that the present invention provides a solid-state image pickup apparatus capable of broadening a dynamic range for thereby accomplishing adequate shading correction free from polarization.

The entire disclosure of Japanese patent application No. 2002-228562 filed on Aug. 6, 2002, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A solid-state image pickup apparatus comprising:
    a plurality of photo-sensors arranged in a direction of row and a direction of column, each of said plurality of photo-sensors corresponding to a particular pixel included in an imaging frame, each of said plurality of photo-sensors comprising a first photosensitive cell having first sensitivity for photoelectrically transducing incident light to generate a signal charge and a second photosensitive cell having second sensitivity lower than the first sensitivity for photoelectrically transducing incident light to generate a signal charge; and
    a corrector executing shading correction on a first image signal derived from said first photosensitive cell in accordance with a shading characteristic of said first photosensitive cell, and on a second image signal derived from said second photosensitive cell in accordance with a shading characteristic of said second photosensitive cells,
    wherein said first photosensitive cell has a first photosensitive area and the second photosensitive cell has a second photosensitive area smaller than the said first photosensitive area, and
    wherein the shading characteristic of said first photosensitive cell used by said corrector relates to said first photosensitive area and the shading characteristic of said second photosensitive cell used by said corrector relates to said second photosensitive area.

2. The apparatus in accordance with claim 1, wherein said corrector corrects the first image signal with first shading correction data assigned to said first photosensitive cell and the second image signal with second shading correction data assigned to said second photosensitive cell.

3. The apparatus in accordance with claim 2, wherein each of said plurality of photosensors is arranged at a fixed pitch in the direction of row and the direction of column in a substantially square matrix.

4. The apparatus in accordance with claim 2, wherein each of said plurality of photosensors is shifted from adjoining one of said plurality of photo-sensors by a distance substantially corresponding to a single photo-sensor in the direction of row and the direction of column.

5. The apparatus in accordance with claim 4, further comprising a mixer mixing the first image signal with the second image signal to produce a third image signal, wherein said corrector corrects the third image signal in accordance with a shading characteristic common to said first photosensitive cell and said second photosensitive cell.

6. The apparatus in accordance with claim 1, wherein each of said plurality of photosensors is arranged at a fixed pitch in the direction of row and the direction of column in a substantially square matrix.

7. The apparatus in accordance with claim 1, wherein each of said plurality of photosensors is shifted from adjoining one of said plurality of photo-sensors by a distance substantially corresponding to a single photo-sensor in the direction of row and the direction of column.

8. The apparatus in accordance with claim 7, wherein said corrector uses third shading correction data for both of said first photosensitive cell and said second photosensitive cell.

9. The apparatus in accordance with claim 7, further comprising a mixer mixing the first image signal with the second image signal to produce a third image signal, wherein said corrector corrects the third image signal in accordance with a shading characteristic common to said first photosensitive cell and said second photosensitive cell.

10. A solid-state image pickup apparatus comprising:

a plurality of photo-sensors arranged in a direction of row and a direction of column, each of said plurality of photo-sensors corresponding to a particular pixel included in an imaging frame, each of said plurality of photo-sensors comprising a first photosensitive cell having first sensitivity for photoelectrically transducing incident light to generate a signal charge and a second photosensitive cell having second sensitivity lower than the first sensitivity for photoelectricallyJransducing incident light to generate a signal charge; and a corrector executing shading correction on a first image signal derived from said first photosensitive cell and on a second image signal derived from said second photosensitive cell;

said plurality of photo-sensors each being shifted from adjoining photo-sensor by a distance corresponding to a single photo-sensor in the direction of row and the direction of column;

said first photosensitive cell and said second photosensitive cell of each of said plurality of photo-sensors being positioned closer to a center and an edge of the imaging frame, respectively, wherein at least three photo-sensors are arranged concentrically around the center where the first photosensitive cell and the second photosensitive cell of each of the at least three photo-sensors being positioned closer to the center and the edge of the imaging frame, respectively, and concentrically around the center, and;

said corrector correcting the fist first image signal and the second image signal in accordance with a shading characteristic common to said first photosensitive cell and said second photosensitive cell.

\* \* \* \* \*